(12) United States Patent
Sjöstroöm (10) Patent No.: US 7,525,671 B2
(45) Date of Patent: Apr. 28, 2009

(54) REGISTRATION METHOD AND APPARATUS THEREFOR

(75) Inventor: Fredrik Sjöstroöm, Täby (SE)

(73) Assignee: Micronic Laser Systems AB, Taby (SE)

( * ) Notice: Subject to any disclaimer, the term of this patent is extended or adjusted under 35 U.S.C. 154(b) by 435 days.

(21) Appl. No.: 11/401,457

(22) Filed: Apr. 11, 2006

(65) Prior Publication Data

US 2007/0236695 A1 Oct. 11, 2007

(51) Int. Cl.
*G01B 11/14* (2006.01)
(52) U.S. Cl. ........................ 356/620; 356/401
(58) Field of Classification Search ................ 356/401, 356/620
See application file for complete search history.

(56) References Cited

U.S. PATENT DOCUMENTS

| | | | |
|---|---|---|---|
| 5,849,441 A | 12/1998 | Nara et al. | |
| 7,388,663 B2 * | 6/2008 | Gui | 356/401 |
| 2005/0099628 A1 | 5/2005 | Kokumai | |
| 2006/0141373 A1 * | 6/2006 | Casper Bijnen et al. | 430/22 |

FOREIGN PATENT DOCUMENTS

| | | |
|---|---|---|
| EP | 0822455 | 6/2000 |
| EP | 1477857 | 11/2004 |
| EP | 1482375 | 12/2004 |
| JP | 5313380 | 11/1993 |
| JP | 6151564 | 5/1994 |

OTHER PUBLICATIONS

International Search Report and Written Opinion dated Sep. 11, 2007 for International Application No. PCT/EP2007/003229.
International Preliminary Report on Patentability dated Jun. 10, 2008 for International Application No. PCT/EP2007/003229.

* cited by examiner

*Primary Examiner*—Roy M Punnoose
*Assistant Examiner*—Michael Lapage
(74) *Attorney, Agent, or Firm*—Harness, Dickey, & Pierce, P.L.C.

(57) ABSTRACT

The present invention relates to a method to determine a position of at least one mark provided on a substrate, comprising the actions of: detecting a first mark on said substrate by using a first detector, detecting a first set of marks comprising at least a second mark on said substrate by using a second detector, computing a first list of relative distance(s) between said first mark and mark(s) in said first set of marks, detecting the second mark on said substrate by using one of said first or said second detectors, detecting a second set of marks comprising at least said first mark on said substrate by using an available detector, computing a second list of relative distance(s) between said second mark and mark(s) in said second set of marks, determining the position of at least one mark by using the information in said first and said second lists of relative distance(s).

23 Claims, 9 Drawing Sheets

FIG. 4A
Plate to measure
(minimum distance between two marks>possible minimum head distance)

400

FIG. 4D
Measurement a-i

FIG. 4C
Measurement a-c

FIG. 4B
Measurement a-b

FIG. 5A

| Ref A | | Ref E |
|---|---|---|
| a-b=a1 | | e-a=e1 |
| a-c=a2 | | e-b=e2 |
| a-d=a3 | | e-c=e3 |
| a-e=a4 | | e-d=e4 |
| a-f=a5 | | e-f=e5 |
| a-g=a6 | | e-g=e6 |
| a-h=a7 | | e-h=e7 |
| a-i=a8 | | e-i=e8 |

Perimeter drive (not central shaft)

Stage supported along the rim and light source(s) under the stage

REGISTRATION METHOD AND APPARATUS THEREFOR

TECHNICAL FIELD

The present invention relates to a registration measurement method and an apparatus therefore and, more particularly, it relates to a registration measurement method suitable for registration or positioning of substrates in mask/reticle writers and/or positioning of substrates in stepper/aligners and an apparatus therefor.

BACKGROUND OF THE INVENTION

When a large display or part of a display, color filter or another similar application, is produced, an exposure system transfer an image from a glass plate, preferably made from high quality quarts, onto a rather large substrate, which may have dimensions up to 1800 mm times 2400 mm. The exposure system includes an aligner, or stepper, that emits light through the glass plate and onto the substrate.

It is very important that registration of masks, i.e., the absolute placement in a coordinate system, is good enough to permit masks from different systems to fit together, e.g., the color filter and a TFT-array. Furthermore, large TFT-substrates may use one, two or more masks stitched together to cover a large exposure area.

A requirement for good alignment mark positioning determination in conventional registration system is inter alia a stable coordinate system, for instance a tradiational XY-coordinate system. A potential problem may arise when many positions have to be measured and the time to perform said measurement is significant, i.e., during a long measuring period drifts of any type may arise.

SUMMARY OF THE INVENTION

Accordingly, it is an object of the present invention to provide a method for measuring alignment mark positions with reduced process time.

This object, among others, is according to a first aspect of the invention attained by a method to determine a position of at least one mark provided on a substrate, comprising the actions of detecting a first mark on said substrate by using a first detector, detecting a first set of marks comprising at least a second mark on said substrate by using a second detector, computing a first list of relative distance(s) between said first mark and mark(s) in said first set of marks, detecting the second mark on said substrate by using one of said first or said second detectors, detecting a second set of marks comprising at least said first mark on said substrate by using an available detector, computing a second list of relative distance(s) between said second mark and mark(s) in said second set of marks, determining the position of at least one mark by using the information in said first and said second lists of relative distance(s).

The invention also relates to an apparatus to determine a position of at least one mark provided on a substrate, comprising a rotatable substrate holder, a guiding rail movable in a first direction, at least a first and a second detector provided on said guiding rail and movable in a second direction essentially perpendicular to said first direction, at least one interferometer capable to measure a relative distance between said first and said second detector.

Further characteristics of the invention, and advantages thereof, will be evident from the detailed description of preferred embodiments of the present invention given hereinafter and the accompanying FIGS. 1-11, which are given by way of illustration only, and thus are not limitative of the present invention.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Further, the preferred embodiments are described with reference to a substrate. It will be obvious to one ordinary skill in the art that said substrate may be a reflective substrate or a transmissive substrate.

Figure 1:
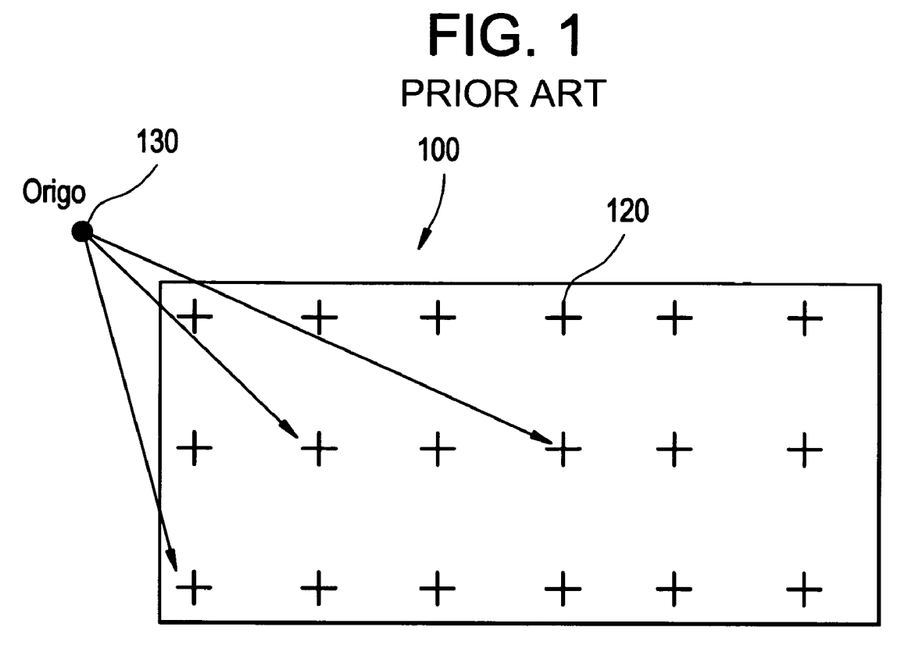
FIG. 1 illustrate schematically a prior art measurement concept when determining positions of alignment marks in a coordinate system.

FIG. 1 illustrates a classic measurement concept, i.e., a coordinate measurement system, for instance a XY coordinate system, where registration of marks 120 arranged on a substrate 100 are calculated from measurement of absolute positions relative an origo 130.

Figure 2:
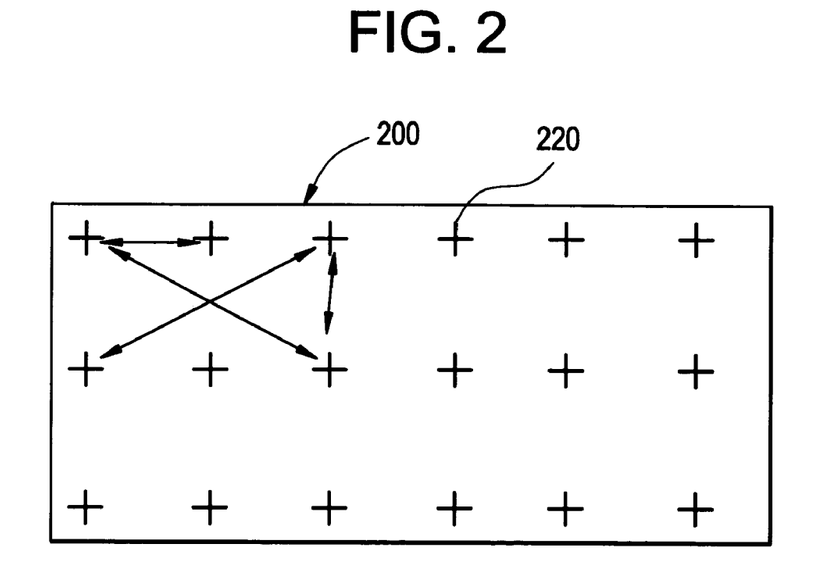
FIG. 2 illustrates schematically an example embodiment according to the present invention of a measurement concept when determining positions of alignment marks.

FIG. 2 illustrates a measurement method according to an example embodiment of the present invention. In the inventive method measurement is based on measuring distance between marks 220 provide on a substrate 200, i.e., mutual distances instead of absolute positions relative an origo as in the prior art method.

Figure 3:
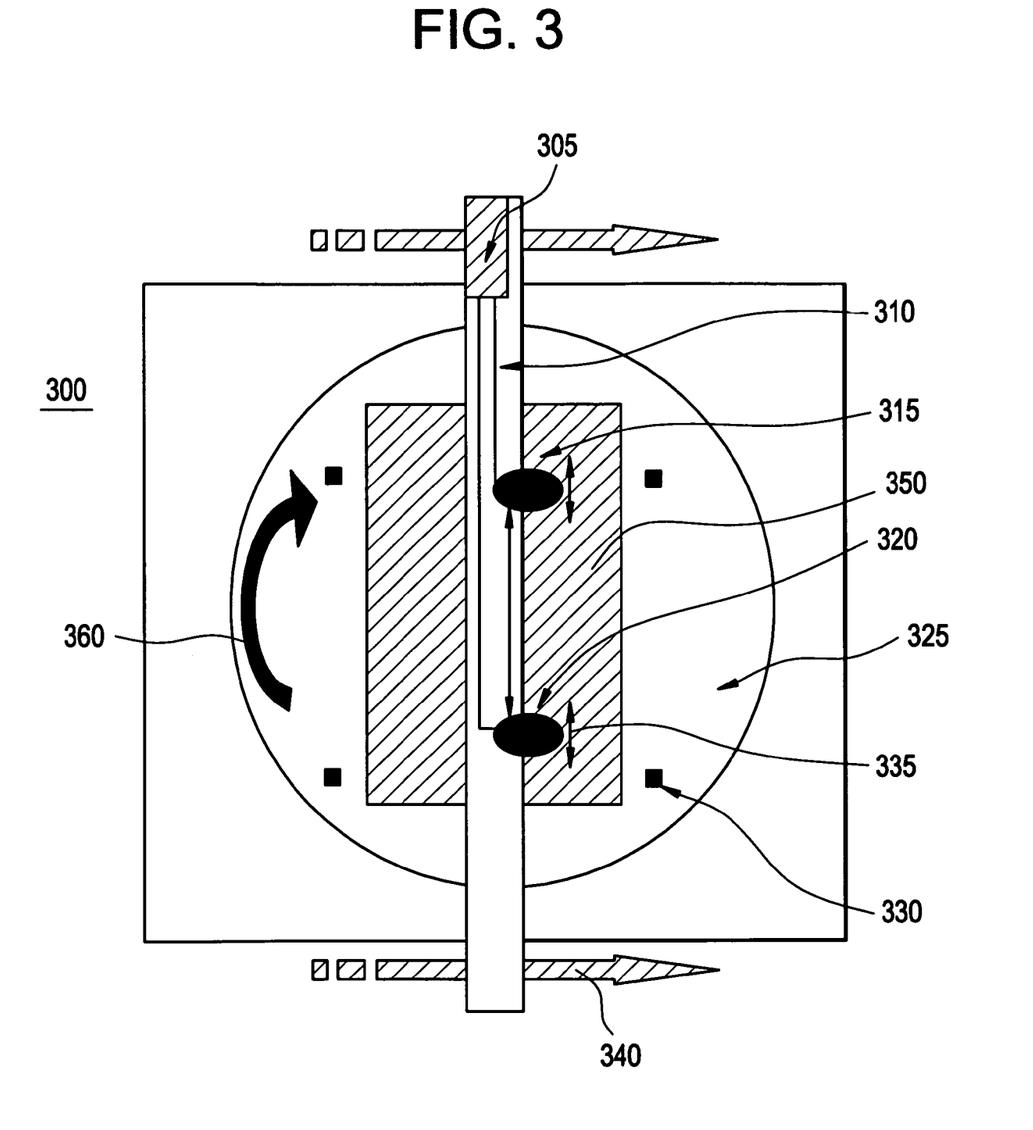
FIG. 3 illustrates a view from above of an example embodiment of a measurement apparatus according to the present invention.

FIG. 3 illustrates a view from above of an example embodiment of a measurement apparatus 300 according to the present invention. Said measuring apparatus 300 comprising a distance measuring device 305, a support frame 310, a first detector 315, a second detector 320, a rotatable stage 325, optional stage alignment marks 330. The distance measuring device may for instance be an interferometer laser. In the illustrated example embodiment in FIG. 3, said distance measuring device 305 is arranged fixed on said support frame 310. Said distance measuring device keeps control of the distance between said first detector 315 and said second detector 320. This is accomplished by measuring the distance between to said first detector 315 and said second detector 320 at each moment in time. The distance between said first detector 315 and said second detector 320 is provided by computing the difference between said distances. In an alternative embodiment a distance measuring device is provided on one of said first detector 315 or said second detector 320. In such an embodiment one will be provided with the absolute distance between said first and said second detector immediately without any calculation as in the previous example.

The support frame supports in this example embodiment the first detector 315, the second detector 320 and said distance measuring device 305. The support frame is provided to move in a first direction 340 over a substrate 350. Said first detector and said second detector are movable in a second direction 335, said second direction 335 may in an example embodiment be essentially perpendicular to said first direction 340.

The stage 325, upon which said substrate 350 may be provided, may be rotatable, denoted in FIG. 3 by reference numeral 360, around its central axis. Said stage may optionally be provided with alignment marks 330. Said alignment marks together with alignment marks provided on said substrate 350 may be used in order to align said substrate 350 on said stage 325, or for calibration purposes.

Figure 4A:
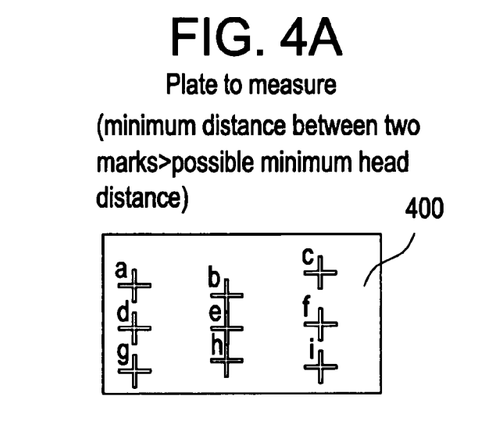
FIG. 4a-d illustrate example embodiments of how different alignments marks may be measured by the apparatus according to FIG. 3.

FIG. 4a illustrates a view from above of a plate 400 to be measured. Said plate 400 comprises 9 alignment marks denoted a-i in FIG. 4a.

Figure 4B:
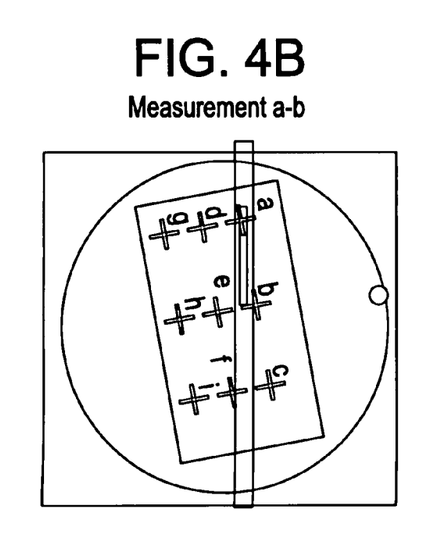
Figure 4C:
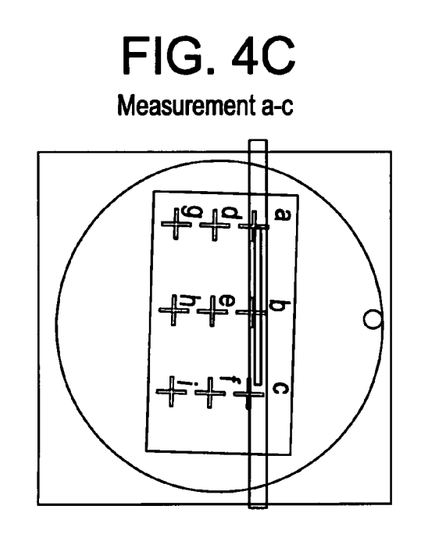
Figure 4D:
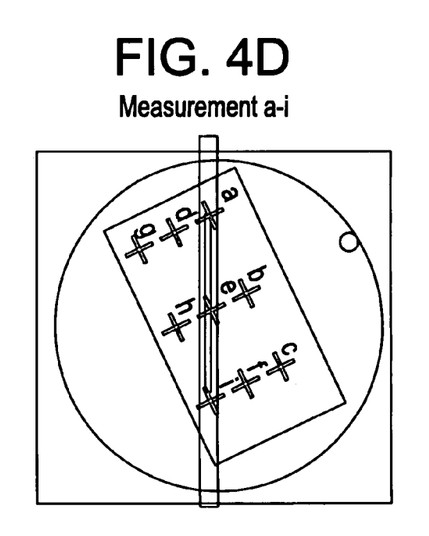

FIG. 4b-d illustrates how a relative distance between alignment mark a and some other alignment marks are measured. To start with one of the detectors, the first detector 315 or the second detector 320, detects alignment mark a. The detector, who has detected alignment mark a, is fixed to said alignment mark while the other detector is locating another alignment mark. In FIG. 4b the other detector, first or second depending on which detector is fixed on alignment mark a, is detecting alignment mark b. The first and second detectors may be moved relative to each other in order to located said alignment mark b. It may also be that the support frame 310 is moved during said location of said alignment mark b as well as a possible rotation of the support upon which said plate is arranged which is currently measured. So, it may be a cooperation of three movements in order to find an alignment mark while fixing one of the detectors on another alignment marks, these movements are 1) the relative movements of the first detector 325 to the second detector 320; 2) the stage rotation; and 3) the movement of the support frame 310. It is to be noted that the first and second detectors may be moved relative to each other so that its relative distance may be enlarged or reduced. The stage may be rotated in a clockwise fashion or in an ant-clockwise fashion. The support frame may be moved in a positive first direction or in a negative first direction.

In FIG. 4c one of the detectors are still fixed on alignment mark a while the other detector is detecting alignment mark c. Compared to FIG. 4b, the distance between the first detector and the second detector has been changed, enlarged distance, the stage has been rotated clockwise and the support frame has been moved slightly to the right, i.e., in the positive direction.

In FIG. 4d one of the detectors are still fixed on alignment mark a, and the other detector is detecting alignment mark i. A movement of the support frame 310, a rotation of the stage and movement of the first and second detectors relative to each other may detect any mutual distance between any two alignment marks. The only restrictions are the minimum distance between two alignment marks which have to be larger than the possible minimum distance between said first and said second detector and the maximum distance between two alignment marks, which is defined as the maximum distance between said first and second detectors, i.e., the width of the support frame 310.

Figure 5A:
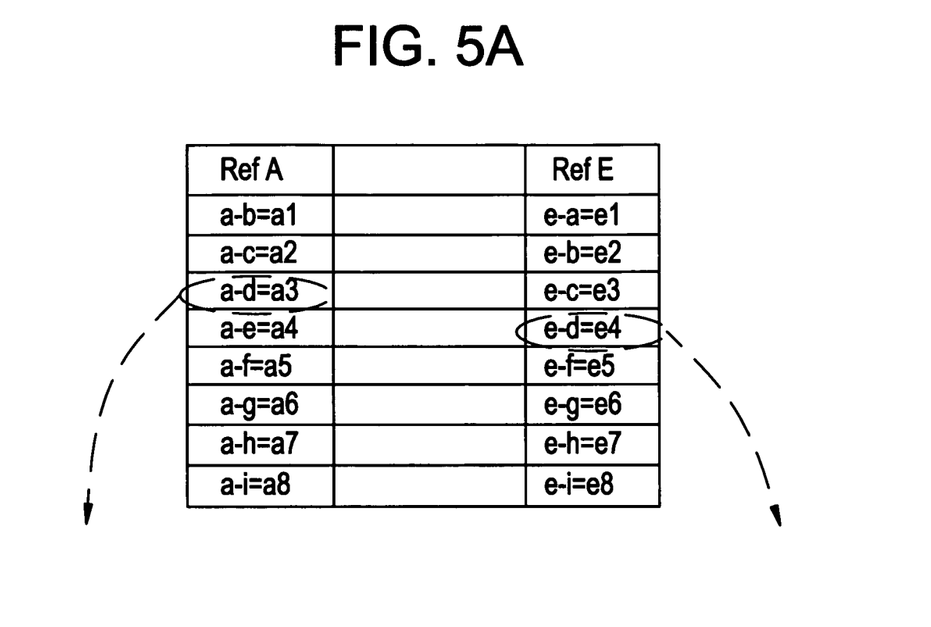
FIG. 5a-b illustrate an example embodiment of a two mark reference method according to the present invention.
Figure 5B:
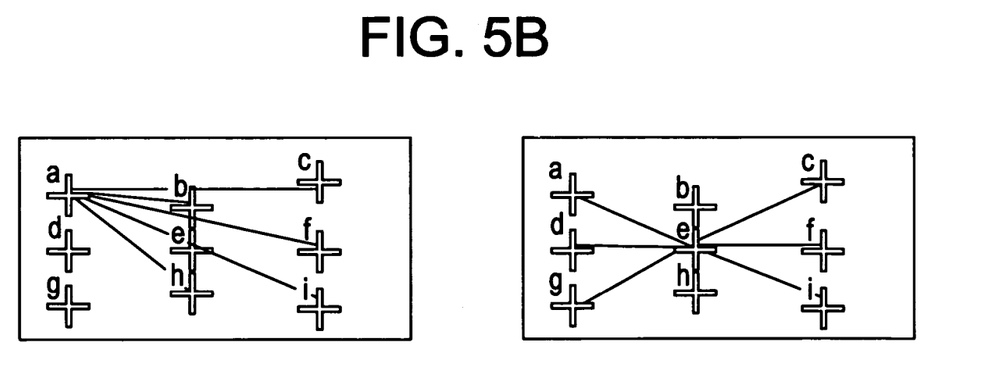

FIGS. 5a and 5b depict an example embodiment of a two mark reference method. In this method the distance is firstly measured between a first alignment mark and all other alignment marks and secondly the distance is measured between a second alignment marks and all other alignment marks. The invention is not limited to the use of only two detectors. A plurality of detectors for measuring distance may be used to optimize throughput and/or accuracy. In the illustrated embodiment said first alignment mark is alignment mark a, and said second alignment mark is alignment mark e. Note that it is just the distance and not vectors in FIG. 5b. In FIG. 5a a list is provided with two columns. A first column represent the distance from alignment mark a to all other alignment marks, each distance to respective alignment mark arranged in separate lines. In a second column the distance from alignment mark e to all other alignment marks, each distance to respective alignment marks in separate lines. From this list of distances from two alignment marks it is possible to determine all other relative distances between all alignment marks, the following illustrations will show how this may be accomplished.

Figure 6A:
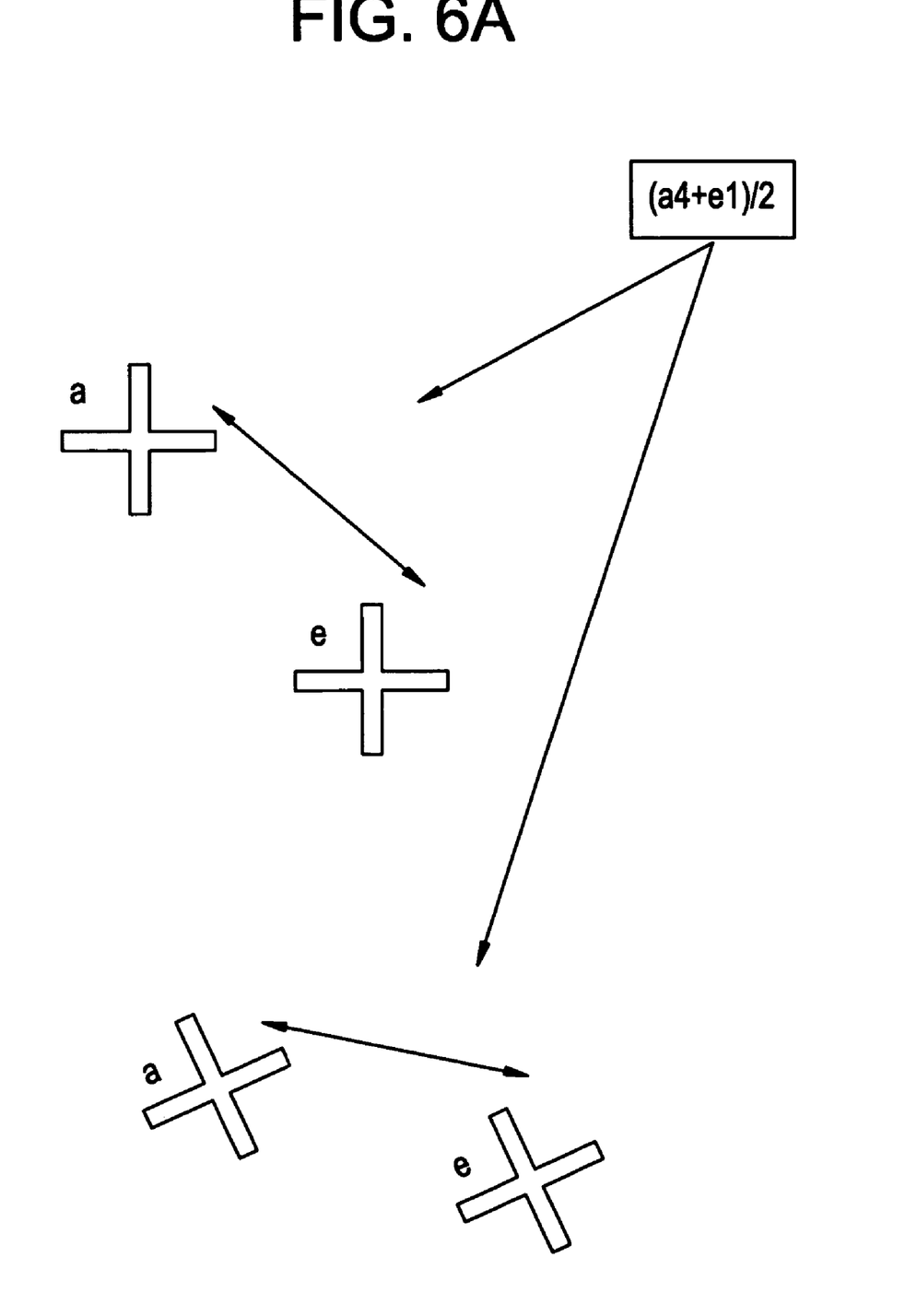
FIG. 6a illustrates two reference marks arranged in an imaginary coordinate system.

FIG. 6a illustrates that alignment marks a end e may be placed in an imaginary coordinate system where rotation of said alignment marks are not important. This is because we only measure the mutual distance and not the distance relative to a fixed origin. FIG. 6a also illustrates that the distance between a and e should be equal to the distance between e and a. Due to misperfection in any measurement system, a mean value of two measurement may better represent the reality than a single measurement.

Figure 7:
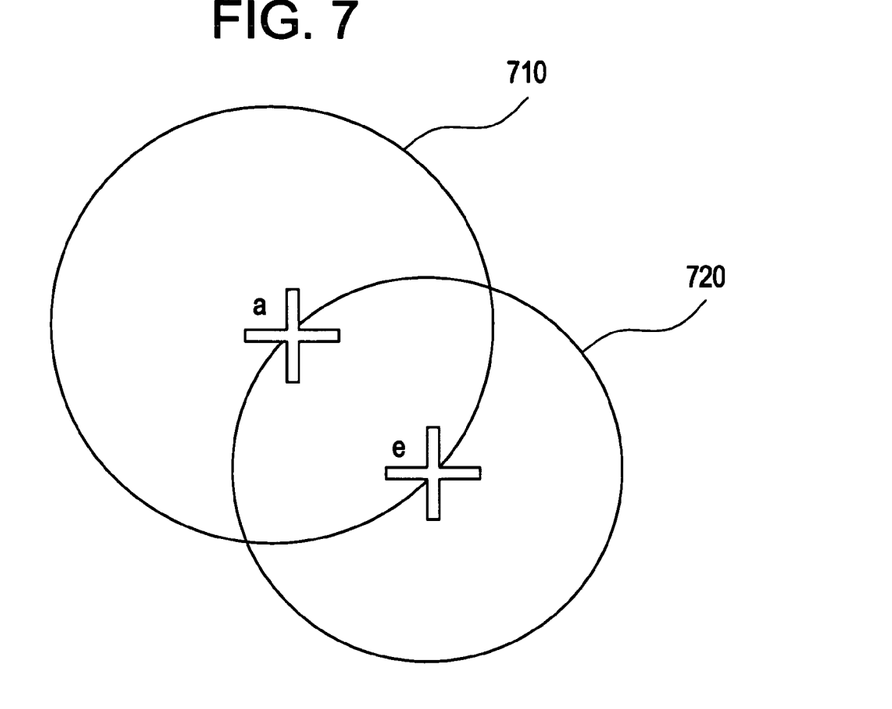
FIG. 7-8 illustrates en example embodiment according to the present invention of how another mark may be found.
Figure 8:
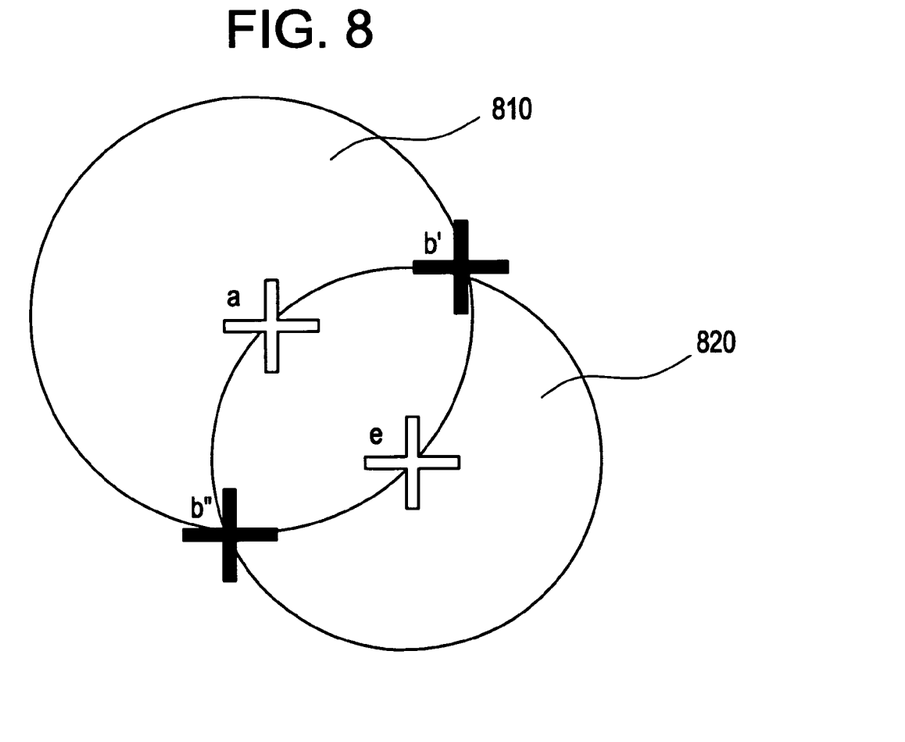

FIG. 7 illustrates how a position of a third alignment mark may be found out of the list of measurement from two alignment marks. The alignment mark to be found its position of is alignment mark b. A first circle 710 with a radius equal to the distance from alignment mark a to alignment mark b is made with its center coinciding with alignment mark a. A second circle 720 with a radius equal to the distance from alignment mark e to alignment mark b is made with its center coinciding with alignment mark e. The first and second circles 710, 720 intersect with each other in this embodiment at two points. FIG. 8 depicts that alignment mark b may be found at any of these intersection points b', b" of said first circle 810 with sad second circle 820, however one of the intersection points b', b" represent a false position of the alignment mark b.

Figure 9:
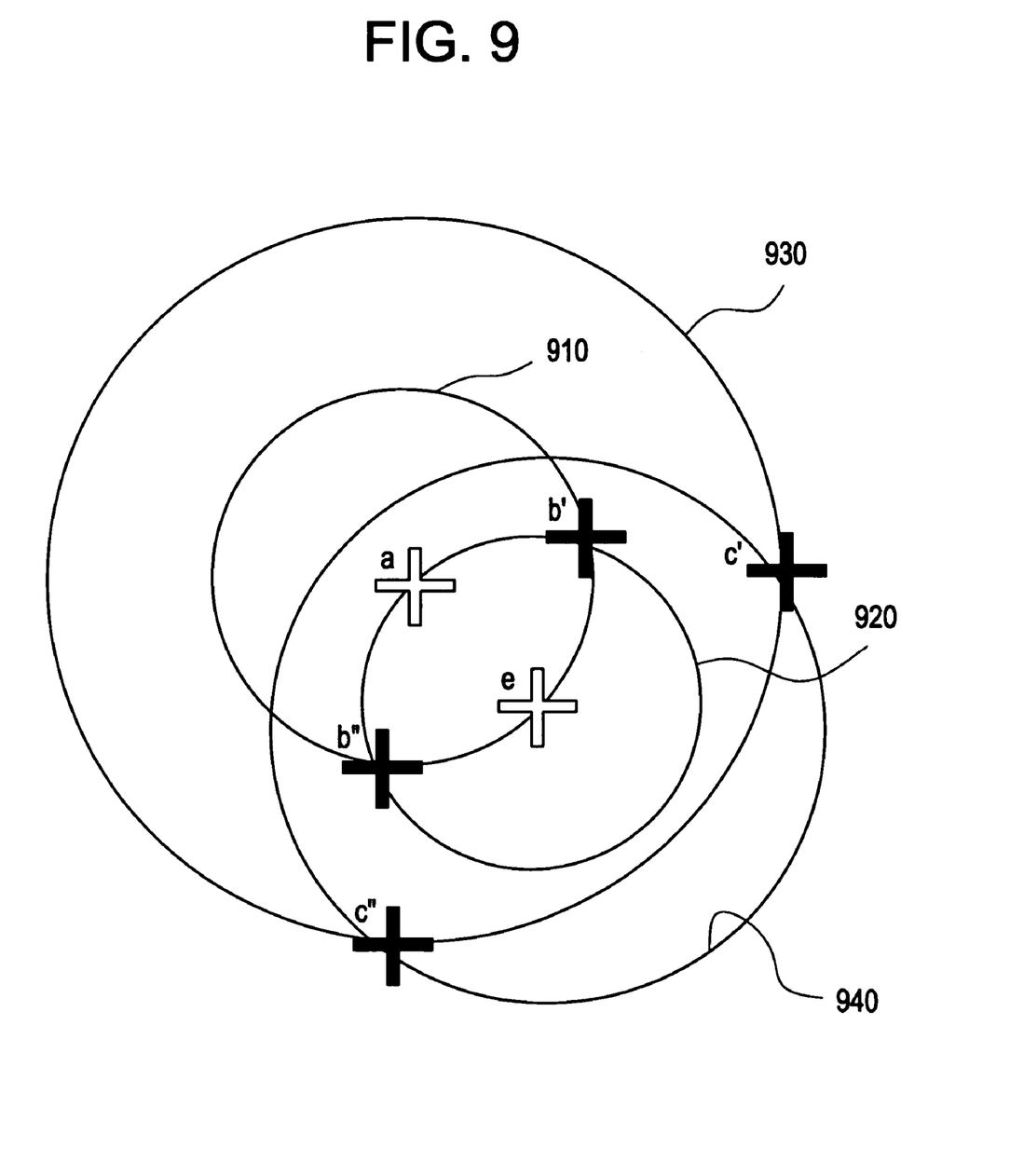
FIG. 9 illustrates an example embodiment according to the present invention of how yet another mark may be found.

FIG. 9 illustrates how a position of alignment mark c may be determined. A third circle 930 having a radius equal to the distance from alignment mark a to alignment mark c is made with a center coinciding with alignment mark a. A fourth circle 940 having a radius equal to the distance from alignment mark e to alignment mark c is made with a center of said circle coinciding with alignment mark e. The third circle 930 and the fourth circle 940 intersect with each other at two points c' and c". One of these intersections c', c" represent the true position of alignment mark c. In the same figure the first circle 910 and the second circle 920 are drawn and the intersection points b' and b" of the first circle 910 with the second circle 920.

Figure 10:
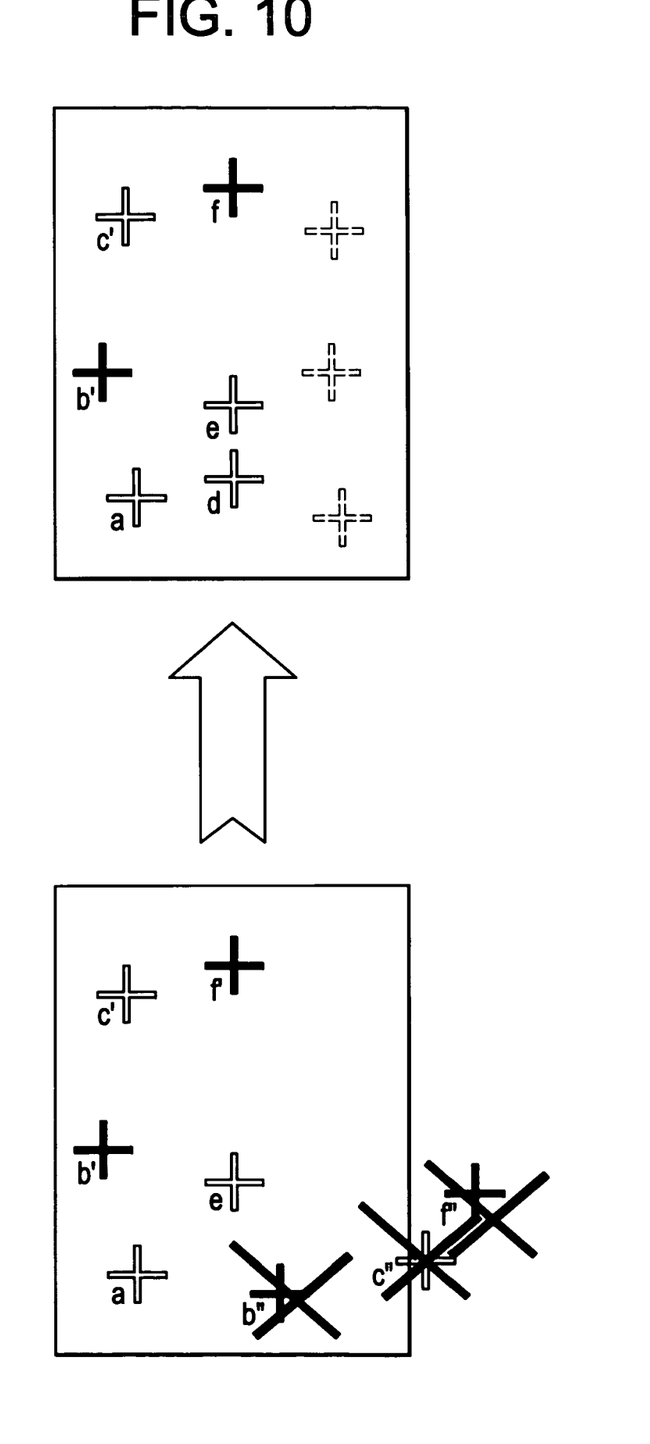
FIG. 10 illustrates an example embodiment according to the present invention of how valid mark positions may be determined.

FIG. 10 illustrates how the true positions of the alignment marks may be found. Alignment marks are provided on a substrate in predetermined positions. If two positions are known, as in this case, one may determine which of the two alternatives b' and b" will represent the true and false position respectively. In the leftmost picture in FIG. 10 five alignment marks are illustrated, a, e, b', b", c', c", f' and f". By comparing the known predetermined positions of alignment mark, i.e., a sort of map where an alignment mark should appear with respect to substrate edges and other alignment marks, with the measured alternatives of the same alignment marks, one may determine which of the alternatives is true or false. In the leftmost picture in FIG. 10 b", c" and f" represent a false position and they are therefore over marked with a cross. In the rightmost picture in FIG. 10 b', c' and f', together with alignment mark a and e represent true alignment mark positions. The dashed alignment marks in the right most figures represent the positions of the rest of the alignment marks on the substrate.

Figure 11:
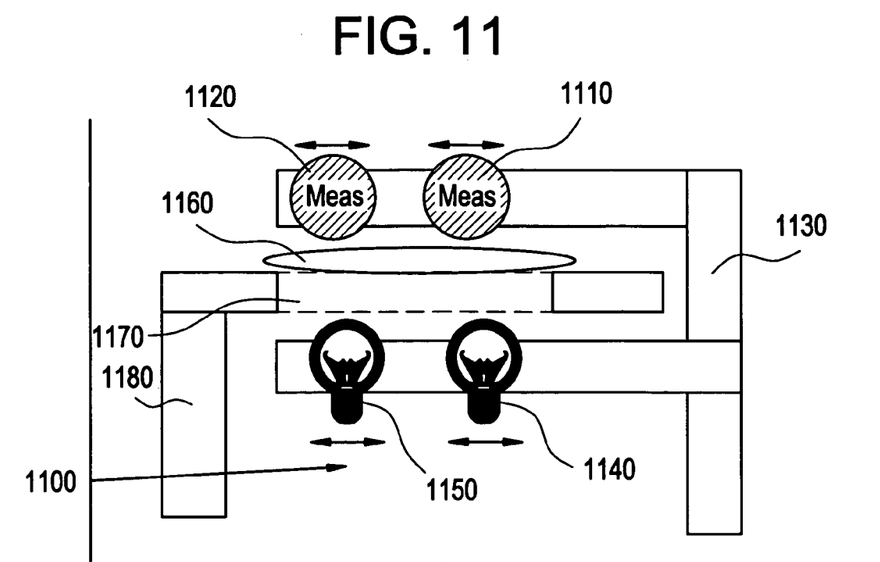
FIG. 11 illustrates an example embodiment of transmission detection of mark according to the present invention.
Figure 12:
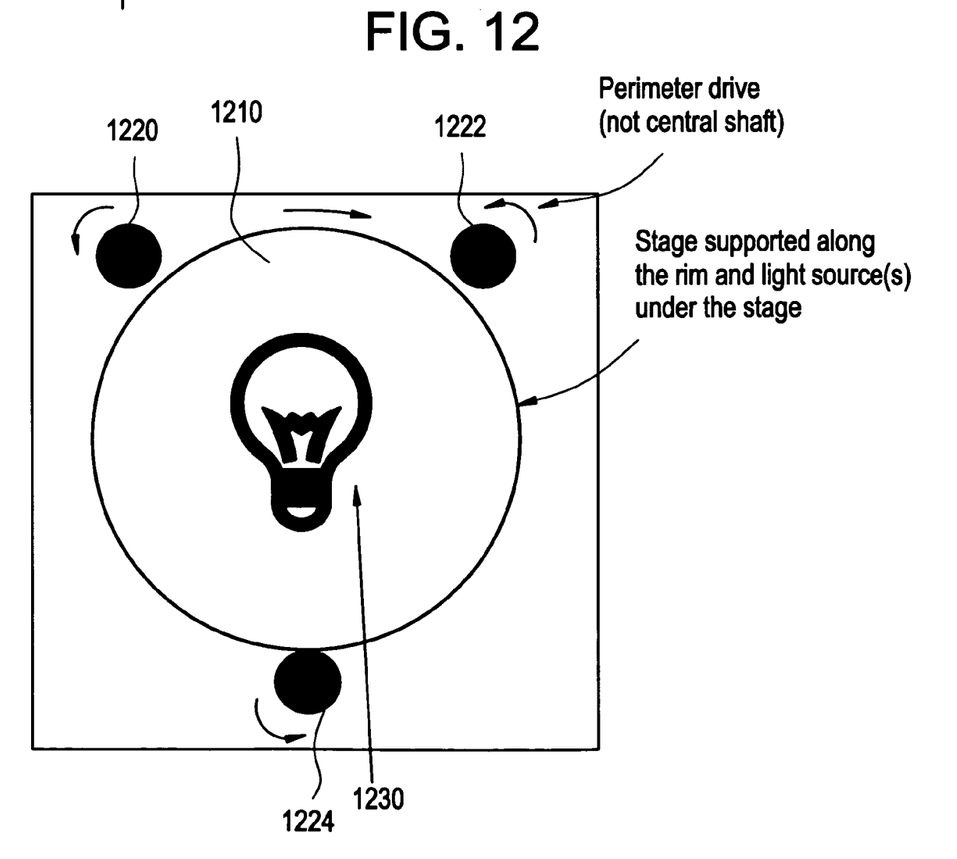
FIG. 12 illustrates an example embodiment of a rotatable stage and supporting mechanism.

FIG. 11 illustrates a side view of an example embodiment of a measuring apparatus 1100 according to the present invention. Said measuring apparatus 1100 comprising a first measuring detector 1110, a second measuring detector 1120, a support frame 1130, a first illumination source 1140, a second illumination source 1150, a substrate 1160, and a transparent support 1170. The first measuring device 1110 and the second measuring device 1120 are movable along a positive and a negative first direction. The support frame 1130 is movable in a second direction, which is essentially perpendicular to said first direction. The first illumination source 1140 and the second illumination source 1150 are movable in the positive and negative first direction. The motion of said first and second illumination sources correlated to the motion of the first and second measuring detectors respectively. The illumination sources illuminate the substrate 1160 from beneath, i.e. in a transmission mode. The transparent support is rotatable, for instance by rotating the transparent substrate support 1170. This rotation can be made according to FIG. 12 which comprises no central shaft. In the inventive example embodiment illustrated in FIG. 12 a stage 1210 is driven by means of perimeter drive, i.e., rotatable wheels 1220, 1222, 1224 contacting an outer rim of the stage 1210. Rotating said wheels 1220, 1222, 1224 in a clockwise fashion will rotate said stage 1210 in a anti-clockwise fashion and vice versa. A light source 1230 is provided beneath/under the stage 1210. Said rotatable wheels may not only have the functionality of contacting and rotating said stage. Said Wheels 1220, 1222, 1224 may also function as to support said stage, i.e., there is no need of a central shaft.

In yet an alternative embodiment according to the present invention said detectors 315 and 320 may be provided on a rotatable gantry, i.e., said detectors may not only be capable of moving back and forth from each other but they may also be rotatable around a point above said stage 325. In such an embodiment said stage 325 may be fixed or rotatable.

In the illustrated embodiment only two measurement detectors are used. In alternative embodiment more than two measurement detectors may be used to speed up the measurement time.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for determining a relative position of a third mark provided on a workpiece, the method comprising:
   detecting a first mark on said workpiece;
   detecting a first set of marks on said workpiece;
   detecting a second mark on said workpiece;
   detecting a second set of marks on said workpiece;
   measuring a first list of relative distance(s) between said first mark and mark(s) in said first set of marks;
   measuring a second list of relative distance(s) between said second mark and mark(s) in said second set of marks, said second set of marks including at least said first mark;
   determining the relative position of the third mark, said third mark being included in both said first set of marks and said second set of marks; wherein
      said determining of the relative position of said third mark is performed by using information from said first list of relative distance(s) measured between said first mark and mark(s) in said first set of marks and information from at least said second list of relative distance(s) measured between said second mark and mark(s) in said second set of marks.

2. The method according to claim 1, further comprising:
   rotating a rotatable gantry upon which at least one detector for performing at least one of said detecting steps is provided.

3. The method according to claim 1, wherein at least one of said first relative distances and said second relative distances is determined by a fixed interferometer.

4. The method according to claim 3, wherein at least one of said first list of relative distances and said second list of relative distances is determined by a fixed interferometer.

5. The method according to claim 3, wherein at least one of said first list of relative distances and said second list of relative distances is determined by an interferometer provided on one detector.

6. The method according to claim 1, wherein at least one of said actions of detecting is performed by means of at least one CCD camera.

7. The method according to claim 1, further comprising:
   moving a plurality of detectors that are independently movable of each other; wherein
      said plurality of detectors are performing at least two of said detecting steps.

8. The method according to claim 1, further comprising:
   moving a guiding rail that is movable back and forth, said first detector and said second detector being provided on said guiding rail.

9. The method according to claim 1, wherein said determining of the relative position of said third mark is performed by using information also from at least a third list of relative distance(s) measured between a fourth mark on said workpiece and mark(s) in a third set of marks on said workpiece, wherein said third set of marks comprises at least one of said first mark and said second mark.

10. The method according to claim 1, wherein said determining of the relative position of said third mark is performed by using information from a plurality of N lists of relative distance(s) measured between N different marks and N different sets of marks, wherein each of said N different marks are comprised in at least one of said N different sets of marks, and wherein N is an integer greater than three.

11. An apparatus for determining a relative position of a third mark provided on a workpiece, the apparatus comprising:
   a workpiece holder;
   a first detector for detecting a first mark on said workpiece:
   a second detector for detecting a first set of marks on said workpiece;

a distance measuring device for measuring a first list of relative distance(s) between said first mark and mark(s) in said first set of marks, means for determining the relative position of the third mark, said third mark being included in both said first set of marks and a detected second set of marks; wherein
said determining of a relative position of the third mark is performed by using information from said first list of relative distance(s) measured between said first mark and mark(s) in said first set of marks and information from at least a second list of relative distance (s) measured between a detected second mark and mark(s) in said second set of marks, and wherein said second set of marks comprises at least said first mark.

12. The apparatus according to claim 11, wherein said distance measuring device is an interferometer.

13. The apparatus according to claim 12, wherein said interferometer is fixed on one of said first and second detectors.

14. The apparatus according to claim 11, wherein said detectors are provided on a rotatable gantry.

15. The apparatus according to claim 11, further comprising:
a rotatable guiding rail upon which said first and second detectors are provided.

16. The apparatus according to claim 11, wherein said workpiece holder is fixed.

17. The apparatus according to claim 11, wherein said workpiece is a substrate.

18. The apparatus according to claim 11, wherein said determining of the relative position of said third mark is performed by using information from a plurality of N lists of relative distance(s) measured between N different marks and N different sets of marks, wherein all of the N different marks are comprised in at least one of said N different sets of marks, and wherein N is an integer greater than two.

19. The apparatus according to claim 18, wherein each of said N lists of relative distance(s) are measured by means of N different distance measuring devices.

20. The apparatus according to claim 18, wherein each of the N pairs of said N marks and said N sets of marks are detected by different pairs of detectors.

21. The apparatus according to claim 11, wherein said second mark and said second set of marks are detected by detectors different from said first detector and said second detector.

22. The apparatus according to claim 11, wherein said second list of relative distance(s) is measured by means of a second distance measuring device different from said first distance measuring device.

23. The apparatus according to claim 11, wherein at least one of said detectors is a CCD camera.

* * * * *